United States Patent [19]

Salib et al.

[11] Patent Number: 6,144,252
[45] Date of Patent: Nov. 7, 2000

[54] HIGH POWER HETEROJUNCTION BIPOLAR TRANSISTOR

[75] Inventors: Mike L. Salib, Millersville; John J. Zingaro, Pasadena, both of Md.

[73] Assignee: Northrop Grumman Corporation, Los Angeles, Calif.

[21] Appl. No.: 08/851,993

[22] Filed: May 6, 1997

[51] Int. Cl.[7] ................................................ H03K 19/82
[52] U.S. Cl. ......................................... 327/574; 327/577
[58] Field of Search ................................... 327/478, 479, 327/482, 574, 575–578; 330/54, 277, 286

[56] References Cited

U.S. PATENT DOCUMENTS

| | | | |
|---|---|---|---|
| 4,788,511 | 11/1988 | Schindler | 330/277 |
| 4,973,918 | 11/1990 | Schindler | 330/277 |
| 5,227,734 | 7/1993 | Schindler et al. | 330/54 |

OTHER PUBLICATIONS

"GaAs HBT's For Microwave Integrated Circuits", *Proceedings of the IEEE.*, vol. 81, No. 12, Dec., 1993, B. Bayraktaroglu, pp. 1762–1784.

*Primary Examiner*—Kenneth B. Wells

[57] ABSTRACT

A plurality of heterojunction bipolar transistors (HBTs), each including one or more HBT cells, are combined so as to drive all of the cells equally and involves coupling the input drive signal via a pair of microstrip transmission lines to the two farthest transistors having a first common circuit node therebetween. A third microstrip transmission line is located between the other two microstrip transmission lines and is connected from the first circuit node to a second circuit node which is common to the two nearer transistors in order to couple the drive signal in an opposite direction to the nearer transistors. In such an arrangement, a negative mutual inductance exists between the center transmission line and the two outer transmission lines. The microstrip transmission lines are designed with physical dimensions and mutual separation distances so that the total inductance of the transmission lines which exists between the circuit nodes equals the mutual inductance be therebetween. The resulting net inductance will be zero and accordingly all four heterojunction bipolar transistors will be driven with signals applied to the respective bases which are equal in magnitude and in phase.

20 Claims, 6 Drawing Sheets

HIGH POWER HETEROJUNCTION BIPOLAR TRANSISTOR

BACKGROUND OF THE INVENTION

1. Field of the Invention

This invention relates generally to high power semiconductor devices and more particularly to high power heterojunction bipolar transistors utilized for microwave applications.

2. Description of Related Art

Heterojunction bipolar transistors (HBTs) are generally known and comprise one or more HBT cells typically fabricated in gallium arsenide (GaAs). Microwave circuits including HBTs can be used for power, low noise and linear amplification as well as power generation in oscillators.

In many respects the GaAs HBT resembles silicon bipolar junction transistors inasmuch as both devices are minority carrier, vertically oriented structures in that vertical current flow from the emitter to collector is modulated by a thin base layer where the injected carriers become minority charges. The emitter of an HBT is fabricated with wider band gap material than that of the base. Although the emitter-base junction is a forward biased p-n junction very similar to a silicon bipolar junction transistor, the presence of a band gap discontinuity at the heterojunction acts to restrict the flow of charges from the base into the emitter while allowing charge flow in the other direction. This imbalance results in current gain and is almost independent of the emitter and base doping levels. The microwave power HBT makes use of this feature. Moreover, the use of a heavily doped base layer is a key to obtaining high power density operation. Device designs can be optimized for high current and high voltage operation while maintaining sufficient microwave power gain for efficient operation. A low base sheet resistance makes it easier to modulate charges over a larger area under the emitter contact. The emitter utilization factor is high enough to use emitter strip widths of several micrometers for microwave frequency operation. As a result, the area under the emitter contact essentially becomes a uniform, large current channel. This is in contrast to the silicon bipolar junction transistor wherein the higher base sheet resistance restricts the emitter current flow to areas around the emitter periphery. For more detailed treatment of the heterojunction bipolar transistor the reader is referred to "GaAs HBTs for Microwave Integrated Circuits," B. Bayraktaroglu, Proc. IEEE, Vol. 81, No. 12, December 1993, pp. 1762–1784.

SUMMARY OF THE INVENTION

Accordingly, it is an object of the present invention to combine two or more heterojunction bipolar transistors in order to form a higher power composite heterojunction bipolar transistor.

It is another object of the invention to provide an improved feed network for driving a plurality of heterojunction bipolar transistor cells with signals having equal magnitude and phase.

And it is a further object of the invention to provide a high power heterojunction bipolar transistor structure which is substantially frequency independent.

And it is still another object of the invention to provide a composite heterojunction bipolar transistor which has the same characteristics as a single unit cell without any degradation in efficiency or frequency response.

The foregoing and other objects are achieved by a method and apparatus for combining a plurality of heterojunction bipolar transistors (HBTs) including one or more HBT cells so as to drive all of the cells equally and which involves at least four heterojunction bipolar transistors which themselves may include a plurality of paralleled cells and wherein the input drive signal is connected via a bifurcated transmission link member including pair of microstrip transmission line members to the two farthest transistors having a first common circuit element therebetween. A third microstrip transmission line is located between the other two microstrip transmission line elements and is connected from the first circuit element to a second circuit element which is common to the two nearer transistors. In such an arrangement, a negative mutual inductance exists between the center transmission line and the two outer transmission lines. The microstrip transmission lines are designed with physical dimensions and mutual separation distances so that the total inductance of the transmission lines which exists between the circuit elements equals the mutual inductance therebetween. The resulting net inductance will be zero and accordingly an input drive signal applied to an input terminal will be coupled equally and in phase to the bases of all four heterojunction bipolar transistors, thus providing an HBT structure providing an increased power output while being frequency independent.

Further scope of applicability of the present invention will become apparent from the detailed description provided hereinafter. It should be noted, however, that the detailed description and the specific examples, while depicting preferred embodiments of the invention, are given by way of illustration only, since various changes and modifications coming within the spirit and scope of the invention will become apparent to those skilled in the art from this detailed description.

BRIEF DESCRIPTION OF THE DRAWINGS

The present invention will become more fully understood from the detailed description provided hereinafter when considered together with the accompanying drawings which are provided by way of illustration only and thus are not limitative of the invention, and wherein.

DETAILED DESCRIPTION OF THE INVENTION

Figure 1:
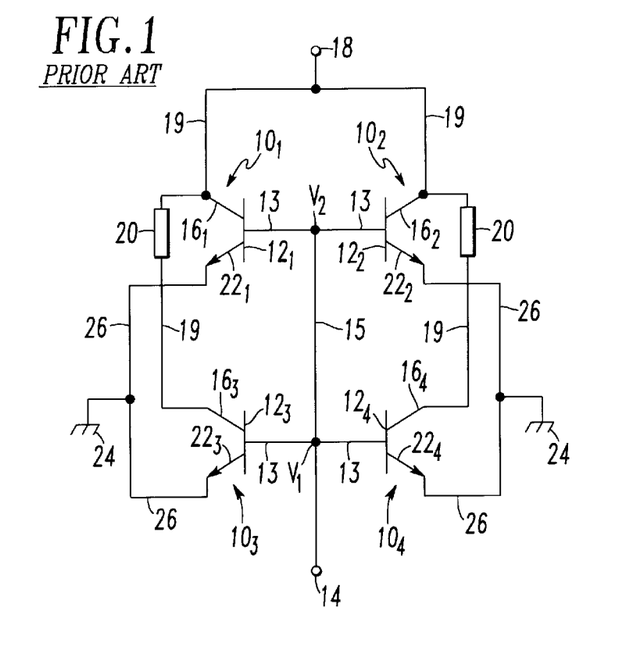
FIG. 1 is an electrical schematic diagram illustrative of a combination of heterojunction bipolar transistor for achieving high power in accordance with the known prior art.

Reference is now to the drawings wherein like reference numbers refer to like elements throughout. FIGS. 1–4 are illustrative of a typical prior art arrangement for interconnecting a plurality of heterojunction bipolar transistors (HBTs) to form a relatively high power HBT structure. As shown in FIG. 1, four HBTs $10_1$, $10_2$, $10_3$ and $10_4$ are connected in what is referred to as a "fishbone" configuration. In such an arrangement, the respective base electrodes $12_1$, $12_2$, $12_3$ and $12_4$ are fed from a common input terminal 14 with comparatively short transmission line elements 13 and 15, typically comprised of microstrip conductor material. The collector electrodes $16_1$, $16_2$, $16_3$ and $16_4$ are connected to a common output terminal 18 via microstrip conductors 19 with the collectors $16_3$ and $16_4$ additionally including isolation resistor elements 20 in the conductors 19. The emitter electrodes $22_1$, $22_2$, $22_3$ and $22_4$ are connected to a common emitter termination element 24 by means of microstrip conductors 26.

Figure 2:
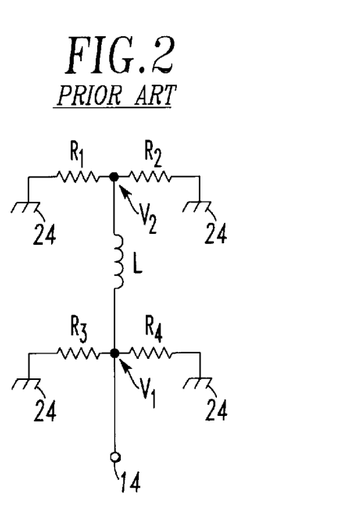
FIG. 2 is an electrical equivalent circuit of FIG. 1.
Figure 3A:
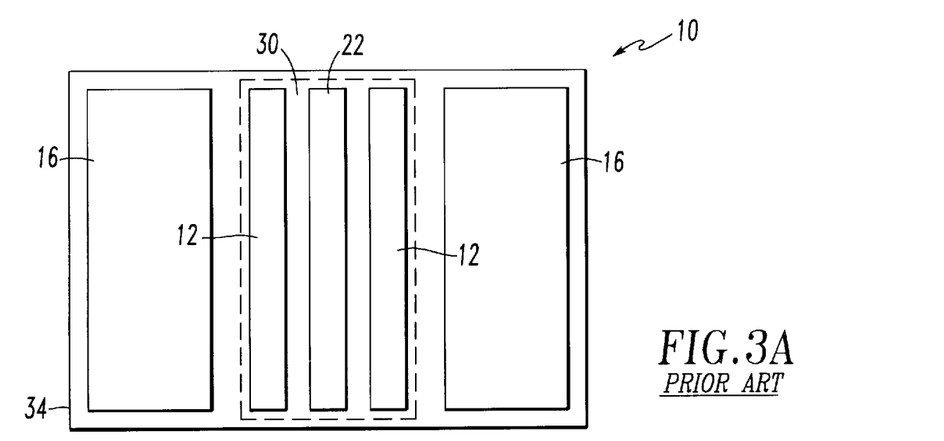
FIGS. 3A and 3B are top planar and front elevational views, respectively, of a typical heterojunction bipolar transistor cell.

The equivalent circuit of the HBT configuration shown in FIG. 1 is shown in FIG. 2 where L represents the inductance of the conductor 15 while $R_1$, $R_2$, $R_3$ and $R_4$ are representative of the respective input resistances of the HBTs $10_1$, $10_2$, $10_3$ and $10_4$. Each of the HBTs $10_1$, $10_2$, $10_3$ and $10_4$ is typically comprised of at least one HBT cell 10 constructed generally in accordance with a semiconductor structure as shown in FIGS. 3A and 3B.

Figure 3B:
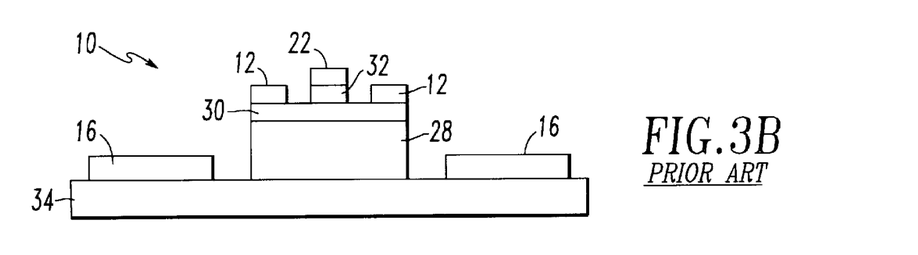

As shown in FIG. 3B, the HBT cell 10 comprises a vertically oriented structure consisting of a collector layer 28, a base layer 30 and an emitter layer 32. The collector layer 28 is fabricated on a subcollector layer 34 on which are formed a pair of collector electrodes or contacts 16. A single emitter electrode 22 is formed on the emitter layer 32 while a pair of base electrodes 12 are located on either side of the emitter electrode 22 and the underlying emitter layer 32. As shown in FIG. 3A, the elements 12, 16 and 22 are generally rectangular in shape with the base and emitter electrodes 12 and 22 consisting of parallel elongated strips of equal size.

Figure 4:
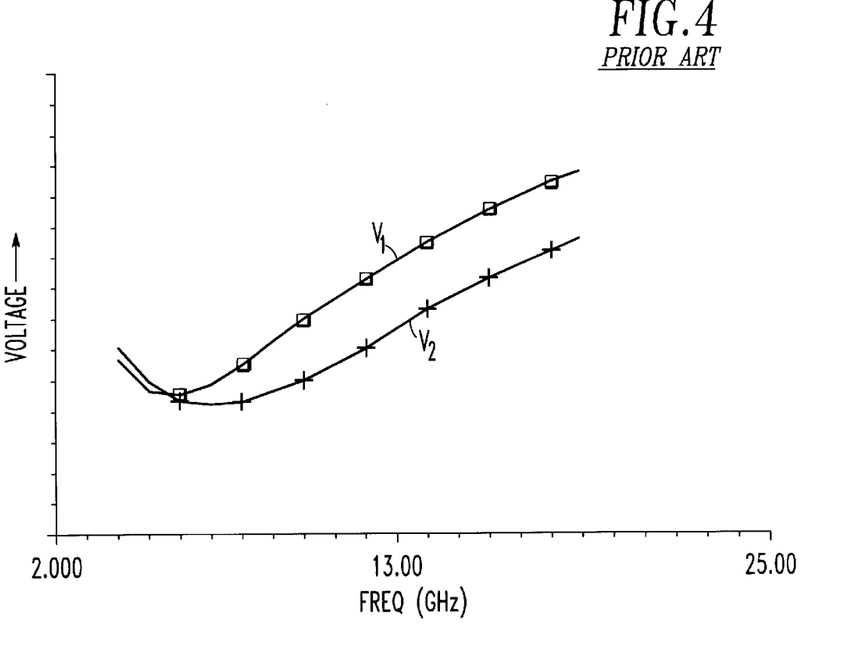
FIG. 4 is a pair of characteristic curves illustrative of the operation of the combination of transistors shown in FIG. 1.

Referring back to FIG. 1, in order to obtain, for example, four times the power output from the four HBTs $10_1$, $10_2$, $10_3$ and $10_4$, the input voltages $V_1$ and $V_2$ applied to the bases $12_1$, $12_2$, $12_3$ and $12_4$ must be equal and in-phase at all frequencies. Accordingly, voltages $V_1$ and $V_2$ must be equal to obtain four times the power of the unit device 10. In the configuration shown in FIG. 1, however, this is not possible since the inductance L of the microstrip conductor 15 will drop the voltage across it so that $V_2$ will be less than $V_1$ and the difference will increase with frequency as depicted in FIG. 4 and also as the input resistances $R_1$, $R_2$, $R_3$ and $R_4$ is lowered.

Therefore, ideally, $V_2$ would be equal to $V_1$ if L=0. It can be seen that the circuit configuration of FIG. 1 suffers from the inability of all of the HBTs $10_1$, $10_2$, $10_3$ and $10_4$ to receive equal and co-phase voltages at all frequencies.

Figure 5:
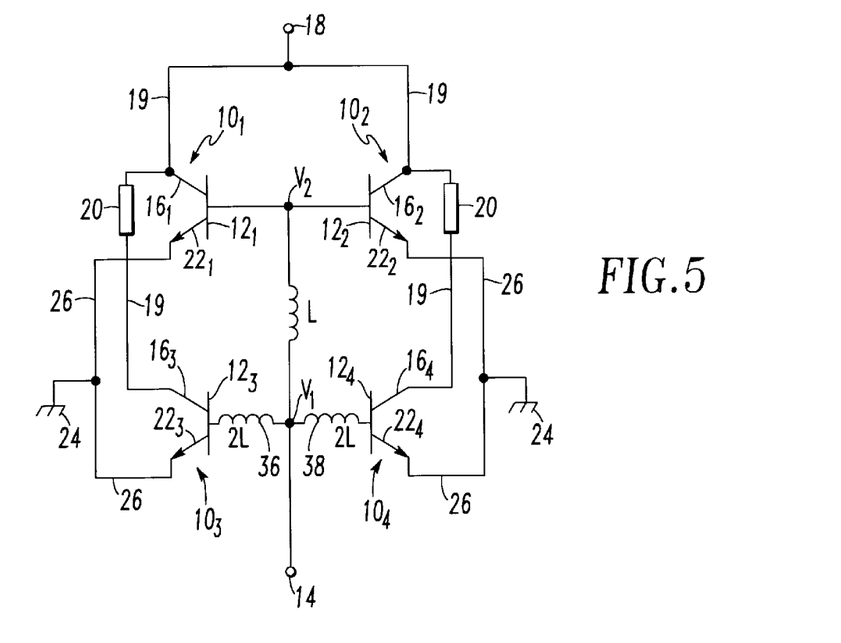
FIG. 5 is an electrical schematic diagram illustrative of a circuit for overcoming the deficiencies of the prior art shown in FIG. 1.
Figure 6:
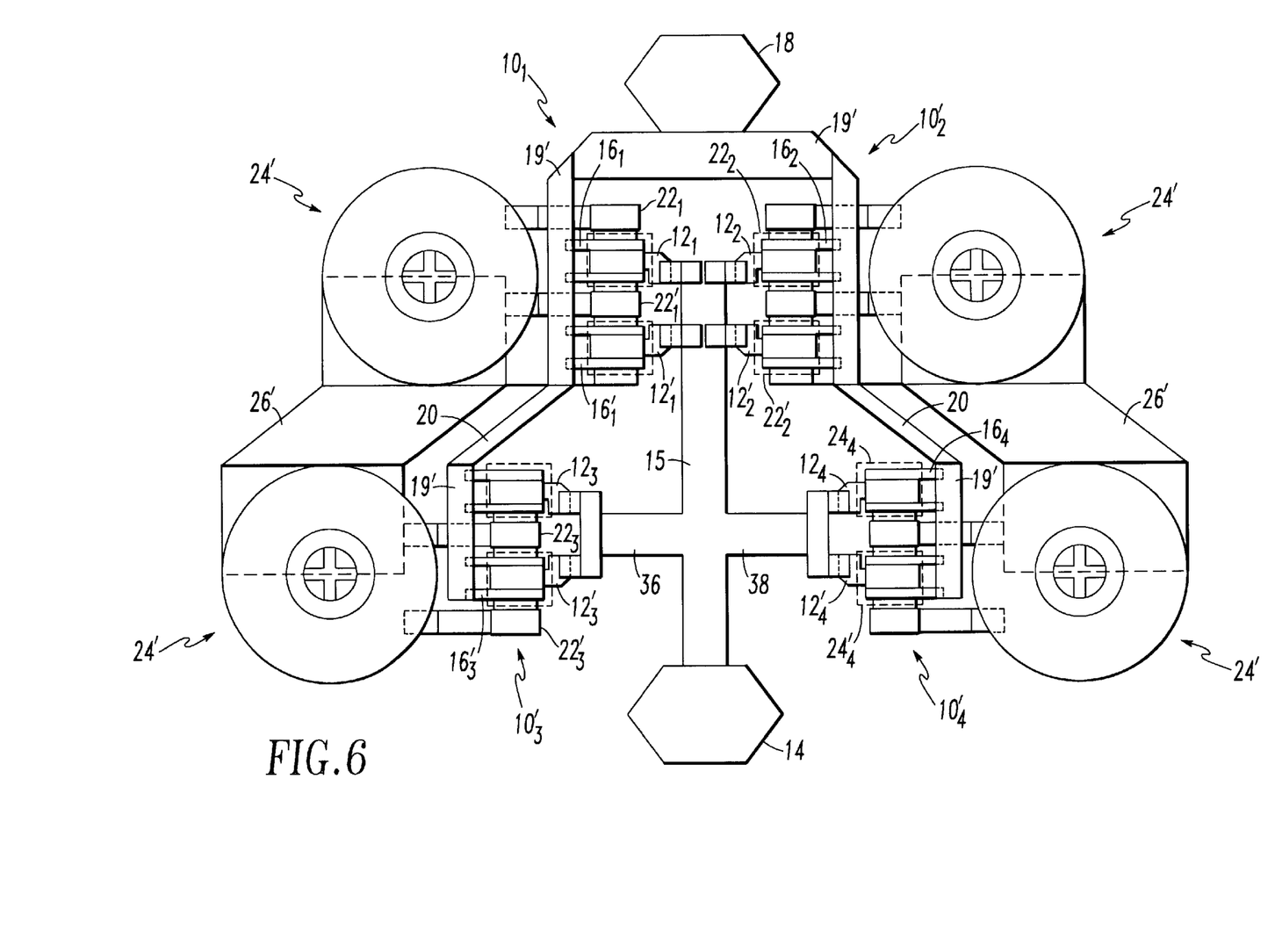
FIG. 6 is a layout of an integrated circuit layout for implementing the configuration shown in FIG. 5.

One means to overcome this problem is shown in FIG. 5 and comprises adding a respective series inductance element 36 and 38 having values of 2L in series with the base contacts $12_3$ and $12_4$ of the HBTs $10_3$ and $10_4$ closest to the input terminal 14 so as to equalize the voltages $V_1$ and $V_2$. This, however, would require that the HBT $10_1$ and $10_3$ and HBT $10_2$ and $10_4$ would have to be physically offset from each other as shown in FIG. 6 in order to accommodate the transmission line elements 36 and 38. While this would equalize the inductance to all four HBTs $10_1$, $10_2$, $10_3$ and $10_4$, it would not result in a desirable layout, where, for example, each of the HBTs is comprised of two cells as shown in FIGS. 3A and 3B located side by side and having base electrodes 12 and $12^1$, collector electrodes 16 and $16^1$ and emitter electrodes 22 and $22^1$. Also FIG. 6 shows a collector bus $19^1$ located on the outer side of the HBTs $10_1$, $10_2$, $10_3$ and $10_4$ between an offset emitter contact bus $26^1$.

Figure 7:
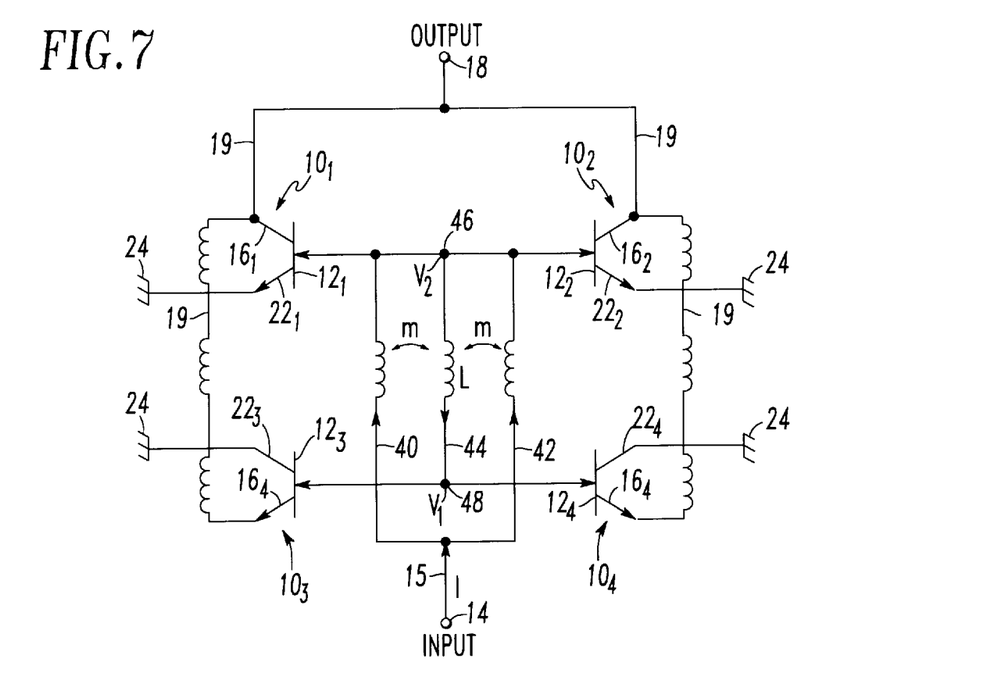
FIG. 7 is an electrical schematic diagram illustrative of a preferred embodiment of a heterojunction bipolar transistor structure in accordance with the subject invention.
Figure 8:
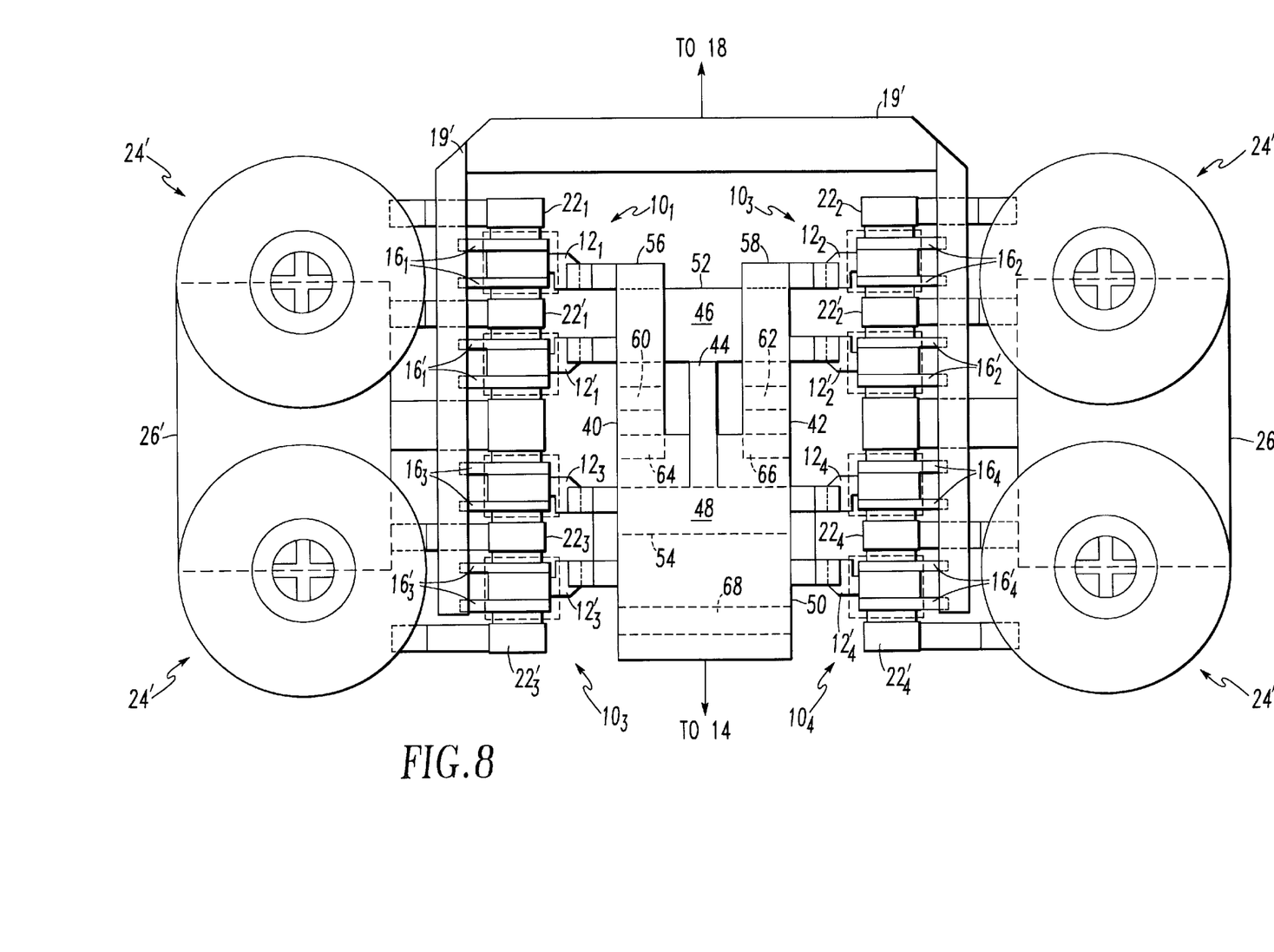
FIG. 8 is illustrative of an integrated circuit layout for implementing the circuit shown in FIG. 7.
Figure 10:
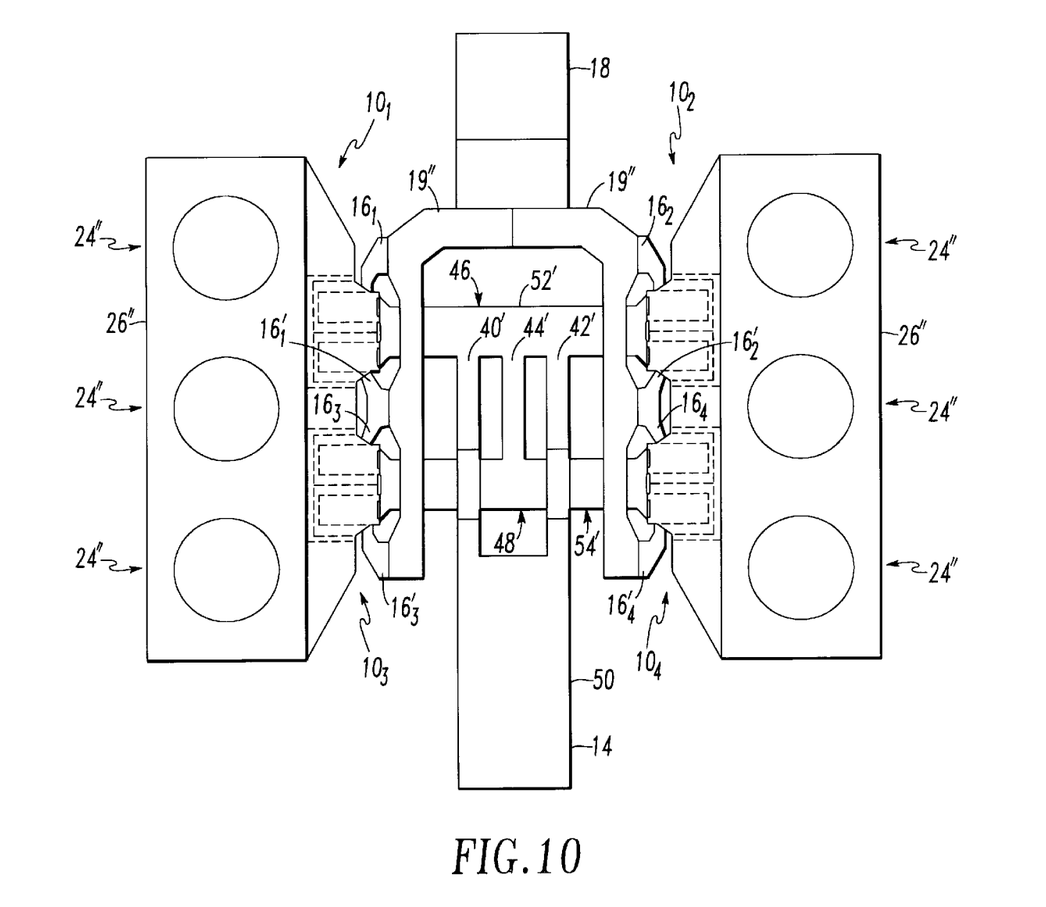
FIG. 10 is illustrative of another integrated circuit layout for implementing the circuit shown in FIG. 7.

This now leads to a consideration of the subject invention which is directed to a more desirable solution to the problem and which is embodied in a circuit as shown in FIG. 7 and which is physically implemented in two semiconductor structures illustrated in FIGS. 8 and 10. The invention is directed to the manner in which the input drive signal applied to terminal 14 is fed to the base electrodes $12_1$, $12_2$, $12_3$ and $12_4$ of the HBTs $10_1$, $10_2$, $10_3$ and $10_4$.

As shown, input terminal 14 is now connected to the base electrodes $12_1$ and $12_2$ of the farther two HBTs $10_1$ and $10_2$ by means of a bifurcated transmission line member 50 includes two separate parallel microstrip transmission line members 40 and 42 without being connected to the two near cells $10_3$ and $10_4$. A third microstrip transmission line member 44, however, is located between transmission line members 40 and 42 and is now connected from the common circuit element 46 between the base electrodes $12_1$ and $12_2$ back to the base electrodes $12_3$ and $12_4$ of the HBTs $10_3$ and $10_4$ via a common circuit element 48 as shown. The circuit elements 46 and 48 are located at opposite ends of microstrip transmission line member 44 with member 44 being connected at the midpoint thereof. A negative mutual inductance m will exist between the center line 44 and the two outer lines 40 and 42. If L is the total inductance of three transmission line numbers 40, 42, and 44 the total inductance $L_T$ between elements 46 and 48 can be stated as $$L_T = L - 2m. \quad (1)$$

Therefore, if L is made equal to 2 m, the net inductance will be 0 and the voltages $V_1$ and $V_2$ at elements 46 and 48 will be equal, which means that any input drive signal applied to terminal 14 will be equally applied to all four HBTs $10_1$, $10_2$, $10_3$, and $10_4$. Furthermore, equal drive will be applied to all frequencies up to at least 20 GHz.

Referring now to FIGS. 8 and 10, shown therein are two plan views of layouts of integrated circuitry for implementing the circuit configuration shown in FIG. 7. Referring first to FIG. 8, four two cell HBTs $10_1$, $10_2$, $10_3$ and $10_4$ are shown such that HBTs $10_1$ and $10_3$ are mutually aligned adjacent microstrip transmission line member 40 while the HBTs $10_2$ and $10_4$ are aligned adjacent microstrip line 42. The microstrip transmission line 50 including the two microstrip transmission line members 40 and 42 constitute an air bridge configuration which overlay microstrip transmission line members 52 and 54 forming the elements 46 and 48 by means of a set of posts 56, 58, 60, 62, 64, 66 and 68.

Figure 9:
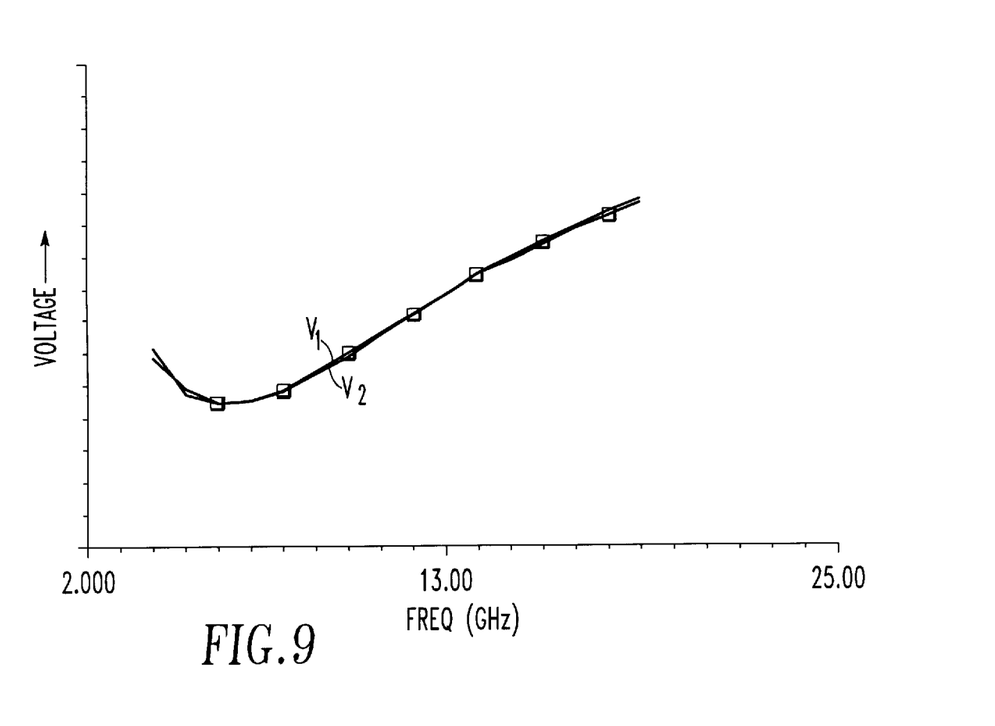
FIG. 9 is a set of characteristic curves illustrative of the operation of the embodiment shown in FIG. 8.

The dimensions and separation distances between the microstrip transmission line members 40, 42 and 44 determine the value of the inductance L and the mutual inductance m such that L=2 m. Such a configuration results in the characteristic curves for voltages $V_1$ and $V_2$ shown in FIG. 9 when the voltage at circuit elements 46 and 48 were sensed and plotted versus frequency relative to the input voltage. The difference between the two voltages was less than 0.5 dB and the phase was less than 10° over the frequency range 4 GHz and 19 GHz.

While the structure shown in FIG. 8 operates as intended, it is to be noted that the microstrip transmission line member $19^1$ which acts as a collector bus is located between the HBTs $10_1$, $10_2$, $10_3$ and $10_4$ and the emitter termination elements $24^1$ which act as a thermal heat sink for the heat generated by the four HBTs.

Referring now to FIG. 10 shown thereat is a modification of the embodiment shown in FIG. 8 and comprises what is at present considered to be the best mode for practicing the invention. FIG. 10 discloses a structure which moves the HBTs $10_1$, $10_2$, $10_3$ and $10_4$ closer to the heat dissipating emitter termination elements $24^{11}$ and involves relocating the microstrip transmission line member $19^{11}$ constituting the collector bus between the HBTs and the two outer microstrip transmission line members $40^1$ and $42^1$ as shown. Again, the physical dimensions and separation distances between the microstrip members $40^1$, $42^1$ and $44^1$ determine the respective values of L and m.

In the design of the microstrip transmission line members 40, 42 and 44 one can calculate the inductance L from the following deviation.

Letting l represents the length of a microstrip transmission line member, then $$\omega l = Z_o \tan 2\pi \frac{l}{\lambda} \quad (1)$$

where $Z_0$ is the characteristic impedance which is a function of the width of the member and the thickness of the substrate on which it is formed, $\lambda$ is the wavelength at a certain frequency f, when and $\omega = 2\pi f$.

For lengths l which are short compared to the wavelength $\lambda$, then, $$\tan 2\pi \frac{l}{\lambda} = \frac{2\pi l}{\lambda} \quad (2)$$

$$\therefore \omega L = Z_o 2\pi \frac{l}{\lambda} \quad (3)$$

and, $$\lambda = V/f \quad (4)$$

where V is the propagation velocity.

Accordingly, $$\omega L = Z_o \frac{2\pi f}{V} l = Z_o \omega \frac{L}{v} \quad (5)$$

or $$L \approx \frac{Z_o l}{v} \quad (6)$$

where $$v = c/\sqrt{\epsilon_{eff}} \quad (7)$$

c is the speed of light and $\epsilon_{eff}$ is effective permittivity, which for $G_a A_s \sim 7.5$.

Then L can be expressed as, $$L = \frac{Z_o l \sqrt{\epsilon_{eff}}}{c} \quad (8)$$

Thus, what has been shown and described is a structure which combines a plurality of HBTs to achieve high power operation and which is insensitive to frequency except for the frequency response of an individual HBT unit cell.

Having thus shown and described what at present is considered to be the preferred embodiments of the invention, it should be noted that the same has been made by way of illustration and not limitation. Accordingly, all modifications, alterations and changes coming within the spirit and scope of the invention as set forth in the appended claims are meant to be included.

What is claimed is:

1. A circuit interconnecting a plurality of heterojunction bipolar transistors so as to produce a high power output at microwave frequencies, comprising:

a plurality of heterojunction bipolar transistors (HBTs) including one or more HBT cells having base, emitter, and collector electrodes, wherein said collector electrodes are connected to a common output terminal, said emitter electrodes are connected to a common emitter termination element, and wherein first and second pairs of said transistors have their respective base electrodes commonly connected to a respective first and second circuit element;

an input terminal for receiving a base drive signal;

a bifurcated transmission line member including a pair of signal transmission line members connected from said input terminal to said first circuit element, said first circuit element and said first pair of transistors being located a farther distance away from said input terminal than said second circuit element and said second pair of transistors;

a third signal transmission line member connected between said first circuit element and said second circuit element at a midway point thereof, and wherein said transmission line members have physical dimensions and mutual separation distances so that the total inductance of said transmission line members is substantially equal to the mutual inductance therebetween, whereby an input signal applied to said input terminal will be coupled equally and in-phase to all of said base electrodes at substantially all frequencies over a predetermined frequency range.

2. A circuit in accordance with claim 1 wherein said third signal transmission line member is located between said pair of signal transmission line members.

3. A circuit in accordance with claim 2, wherein said signal transmission line members are microstrip transmission signal members.

4. A circuit in accordance with claim 3, wherein said signal transmission line circuit members are mutually parallel microstrip members.

5. A circuit in accordance with claim 4 wherein said first and second circuit elements also microstrip transmission line elements.

6. A circuit in accordance with claim 5 wherein said microstrip transmission line members are substantially linear members.

7. A circuit in accordance with claim 6 wherein said pair of transmission line members straddle said third signal transmission line member and connect to said first circuit element.

8. A circuit in accordance with claim 7 and wherein said pair of microstrip transmission line members of substantially equal width and length.

9. A circuit in accordance with claim 8 and additionally including a printed circuit region connecting said emitter electrodes to said emitter termination element.

10. A circuit in accordance with claim 9 and additionally including another printed circuit region connecting all of said collector electrodes to said output terminal.

11. A circuit in accordance with claim 10 wherein said another printed circuit region comprises another bifurcated circuit having a pair of elongated arm members extending between said pairs of transistors and said emitter termination element.

12. A circuit in accordance with claim 10 wherein said another printed circuit region comprises a bifurcated circuit having a pair of elongated arm members extending between said pairs of transistors and said microstrip elements of said pair of transmission line elements.

13. A circuit in accordance with claim 10 wherein each heterojunction bipolar transistor includes at least two identical HBT cells connected in parallel circuit relationship.

14. A method of interconnecting a plurality of heterojunction bipolar transistors to form a relatively high power composite HBT transistor configuration, comprising the steps of:

coupling all of the emitter electrodes of said transistors to a common emitter terminating element;

coupling the collector electrodes of said transistors to a common signal output terminal;

coupling an input signal terminal via a bifurcated transmission line member to a first circuit element common to the base electrodes of at least two heterojunction bipolar transistors which are located relatively remote from the input signal terminal;

coupling said first circuit element via another transmission line member to a second circuit element common to the base electrodes of at least two other heterojunction bipolar transistors which are relatively closer to the input signal terminal;

locating said another transmission line member between a pair of transmission line members of said bifurcated transmission line member; and choosing inductance values and separation distances between said transmission line members such that the total inductance of said transmission line members between said first and second circuit elements and the mutual inductance therebetween are substantially equal and opposite to one another so as to provide a net inductance of substantially zero between said circuit elements whereby an input drive signal applied to said input signal terminal will be applied equally and in phase to the base electrodes of all said transistors.

15. A method in accordance with claim 14, wherein each said of said heterojunction bipolar transistors includes a plurality of heterojunction bipolar transistor cells.

16. A method in accordance with claim 14 wherein said first and second circuit elements are short transmission line members relative to the lengths of said pair of transmission members and said another transmission line member.

17. A method in accordance with claim 14 wherein said transmission line members are microwave transmission lines.

18. A method in accordance with claim 14 wherein said transmission line members are microstrip transmission lines.

19. A method in accordance with claim 14 and additionally including the step of forming said heterojunction bipolar transistors and said transmission line members on a semiconductor substrate.

20. A method in accordance with claim 19 wherein said substrate is comprised of gallium arsenide.

* * * * *